(12) United States Patent
Stegmann (10) Patent No.: US 12,196,941 B2
(45) Date of Patent: Jan. 14, 2025

(54) SAMPLE HOLDER SYSTEM WITH FREELY SETTABLE INCLINATION ANGLES

(71) Applicant: Carl Zeiss Microscopy GmbH, Jena (DE)

(72) Inventor: Heiko Stegmann, Dresden (DE)

(73) Assignee: Carl Zeiss Microscopy GmbH, Jena (DE)

(*) Notice: Subject to any disclaimer, the term of this patent is extended or adjusted under 35 U.S.C. 154(b) by 392 days.

(21) Appl. No.: 17/808,380

(22) Filed: Jun. 23, 2022

(65) Prior Publication Data

US 2023/0003988 A1 Jan. 5, 2023

(30) Foreign Application Priority Data

Jul. 5, 2021 (DE) .......................... 102021207016.7

(51) Int. Cl.
  *G02B 21/26* (2006.01)
  *H01J 37/20* (2006.01)
  *H01J 37/28* (2006.01)

(52) U.S. Cl.
  CPC .............. *G02B 21/26* (2013.01); *H01J 37/20* (2013.01); *H01J 37/28* (2013.01)

(58) Field of Classification Search
  CPC ............ G02B 21/26; H01J 37/20; H01J 37/28
  See application file for complete search history.

(56) References Cited

U.S. PATENT DOCUMENTS

| 8,247,785 | B2 | 8/2012 | Zeile |
| 9,190,242 | B2 | 11/2015 | Biberger |
| 2007/0125958 | A1 | 6/2007 | Tappel |
| 2010/0003907 | A1* | 1/2010 | Hirayama ............... B24B 7/228 |
| | | | 451/398 |
| 2011/0204226 | A1 | 8/2011 | Amador |
| 2011/0226947 | A1 | 9/2011 | Takahashi |
| 2016/0189929 | A1 | 6/2016 | Hammer |
| 2017/0275761 | A1* | 9/2017 | Kamo ..................... C23C 14/54 |
| 2020/0035444 | A1 | 1/2020 | Nicoletti |
| 2020/0180105 | A1* | 6/2020 | Inoue ..................... B24B 51/00 |

FOREIGN PATENT DOCUMENTS

| DE | 10 2010 041 678 A1 | 3/2012 |
| DE | 10 2018 212 511 A1 | 1/2020 |
| EP | 2001038 A2 | 12/2008 |
| JP | 2000-323079 A | 11/2000 |

OTHER PUBLICATIONS

German Office Action, with translation thereof, for corresponding Appl No. 10 2021 207 016.7, dated Apr. 29, 2022.

* cited by examiner

*Primary Examiner* — Nicole M Ippolito
(74) *Attorney, Agent, or Firm* — Fish & Richardson P.C.

(57) ABSTRACT

A sample holder system for holding a microscopic sample in a microscope system comprises a first and a second rotation element, which are rotatably connected to one another. The side surfaces of the two rotation elements in each case enclose an angle $\alpha$, with the result that the rotation elements have a wedge-shaped cross section. The second rotation element is configured to receive a sample, while the first rotation element can be rotatably connected to a holder receiving surface. The rotation elements are each rotatable by an angle $\beta$ about a rotation axis. The inclination of the third side surface on which the sample can be received is settable by combining all of the involved angles $\alpha$ and $\beta$.

20 Claims, 6 Drawing Sheets

SAMPLE HOLDER SYSTEM WITH FREELY SETTABLE INCLINATION ANGLES

CROSS-REFERENCE TO RELATED APPLICATION

This application claims benefit under 35 U.S.C. § 119 to German Application No. 10 2021 207 016.7, filed Jul. 5, 2021. The contents of this application is hereby incorporated by reference in its entirety.

FIELD

The disclosure relates to a sample holder system for particle beam microscopy, that is to say microscopy systems that operate with a beam of charged particles, such as for example scanning electron microscopes (SEM) or ion beam microscopes (focused beam, FIB). Imaging, analysis and/or processing of a microscopic sample using such a particle beam microscope frequently involves orienting the sample in a specific way in three-dimensional space.

BACKGROUND

The spatial orientation of a sample is understood to mean the alignment of the sample in relation to an optical axis, with the spatial orientation of the sample being a result of the sample being turned about one or more axes. Turning of the sample about an axis that extends parallel to the optical axis of the particle beam microscope is referred to here as rotation of the sample. Turning of the sample about an axis that is aligned perpendicular to the axis of rotation is referred to as inclination of the sample, or in the following text also as tilting of the sample.

To enable tilting of the sample in a microscope system, various solutions are known.

For example, a sample stage (five-axis stage) with a tilt axis can be made available in the particle beam microscope. Sample stages typically comprise at least three translational axes (x, y, z) and two rotation axes (R, T). One of the rotation axes serves as tilt axis T, which is arranged perpendicular to the other axis of rotation R. The rotation axis R is typically aligned parallel to one of the optical axes of the microscope system. In general, the sample is applied to a flat sample holder, which in turn is mounted on the sample stage.

When using a five-axis sample stage, the alignment of the tilt axis T in relation to the other movement axes is generally fixed. In order to tilt the sample into a specific spatial orientation, the tilt of the sample about the tilt axis T can be combined with a rotation of the sample stage about the rotation axis R or rotated mounting of the sample on the sample holder.

However, not every particle beam microscope has a sample stage with a tilt axis. Simple particle beam microscopes are often not equipped with a tilt axis for cost reasons. Particle beam laser microscope systems also do not always have a sample stage with a tilt axis. In some particle beam laser microscopes, the laser subsystem does not have a sample stage with a tilt axis, and the angle of incidence of the laser beam in relation to the sample surface consequently cannot be changed. However, since the inclination of the laser cuts produced in principle deviates from the angle of incidence of the laser beam, the sample can be counter-tilted in order to produce laser cuts perpendicular to the sample surface.

In an alternative approach, the sample is applied onto a sample holder having a fixed or a settable tilt angle (what is known as a "pre-tilted sample holder"). The alignment of the tilt axis in relation to the sample holder is typically fixed here. In order to change the alignment of the tilt axis in relation to the sample, the sample is usually mounted on the sample holder in a changed alignment.

A pre-tilted sample holder can be used for example if the tilt angle range of the tilt axis T of a sample stage is not large enough.

A pre-tilted sample holder can additionally be used if the surface of the sample is not plane-parallel to the xy plane of the sample stage. In this case, it might be desirable to tilt the sample, but without rotating the sample. This may exist for example in the case of a sample which is mounted in a non-planar fashion and has structures that have a preferred direction, for example semiconductor structures.

Depending on the availability of features for tilting and rotating the sample stage, the combination with a correspondingly designed pre-tilted sample holder is feasible.

However, a sample holder having a tilt axis may be very small and setting the tilt angle precisely and reproducibly is therefore difficult. This is often the case even if an angular scale is present.

A sample holder having a fixed tilt angle can mean that the tilt angle of the sample surface corresponds to the angle specified by the sample holder only if the sample is mounted such that the sample surface is exactly parallel to the placement surface of the sample holder.

In addition, it may not be possible to change the tilt angle. In order to set another tilt angle, a sample stage with a tilt axis may be additionally used.

Moreover, the applied sample usually cannot be rotated. That is to say, the alignment of the sample in the inclined plane cannot be easily changed. To do so, the placement surface could have a rotatable receiving apparatus. If this is not the case, the sample could be detached and applied in an appropriately turned alignment.

When the sample holder was turned by a rotation of the sample stage about the rotation axis R or by rotated mounting of the sample holder on the sample stage, the effective tilt angles in relation to the x and y axes of the sample stage may not be readily evident. They are typically calculated or ascertained experimentally.

Depending on the specific application, the respectively maximum tilt angles can be of different sizes. Therefore, a flexible system that can offer different maximum tilt angles for different applications would be desirable.

Various five-axis stages and six-axis stages for microscope systems are known.

EP 2 001 038 A2 (Zeile & Schertel) describes a pre-tilted sample holder.

DE102018212511 B4 (Nicoletti & Biberger) discloses a sample holder system that offers an additional degree of freedom of movement.

SUMMARY

It would be desirable to propose an apparatus and a method that enable a precise and stable alignment of the sample surface across all solid angles. It could be favourable here if the inclination of the sample surface were continuously adjustable.

The present disclosure seeks to provide a sample holder system with which a sample to be examined can be oriented continuously in relation to an optical axis of a microscope system. The sample holder system can allow for a precise and stable alignment of the sample surface across all solid angles, which can make the examination and/or processing of the sample in the microscope system easier.

The spatial orientation of the sample can be changed by tilting. Tilting is understood to mean the spatial turning of the sample about an axis (tilt axis, as it is known), wherein the tilt axis is generally aligned perpendicular to an optical axis of the microscope system. For example, the tilt axis can be aligned perpendicular to the optical axis of the electron or ion beam column.

A spatial orientation is understood to mean the alignment of the sample in relation to the optical axis/axes of the microscope system in which the sample is observed and/or processed.

The present disclosure also seeks to provide methods for continuously adjusting the inclination angle of a sample in a microscope system, wherein the sample can be inclined in any desired spatial direction.

The present disclosure further seeks to provide a computer program product which causes a microscope system to carry out the method according to the disclosure.

The disclosure is based on the finding that the inclination angle of a held sample can be set in a sample holder system by the coaction of at least two wedge-shaped rotation elements, which are arranged one after the other in an open kinematic chain.

For this purpose, the rotation elements can be connected to one another in a rotatable manner. By selectively rotating the individual rotation elements, any desired inclination angles θ (tilt angles) of a sample receiving surface (and thus of the held sample) can be continuously adjusted in terms of size and direction. The sample is tilted in relation to one of the optical axes of the microscope system, in which the sample holder system is used.

In order to tilt the sample in accordance with the disclosure, at least two rotation elements of the sample holder system can have a wedge-type cross-sectional profile. This can be achieved by each rotation element having two side surfaces that lie opposite one another but are not aligned parallel to one another. Rather, the side surfaces can enclose a non-zero angle α. The angle α thus in each case can form the wedge angle of the wedge-shaped rotation element. For example, the angle α can be an acute angle. The wedge angles α1 of the first rotation element and α2 of the second rotation element can have a value that is greater than 0° and at most 45°, for example 10°. In a configuration, the angle α=45°.

The rotation elements can each have a circular, elliptical or square shape or have a base with a different shape.

The first rotation element can be designed such that it can be received on a holder receiving surface of a base element. The base element can be embodied in the form of a base plate of compatible design with respect to a receiving apparatus of a sample stage. That means that the baseplate of the sample holder system is receivable on the sample stage of a microscope system.

It is also conceivable that the sample holder system is used in a microscope system that has no sample stage. In this special case, the sample holder system according to the disclosure can assume the function of a sample stage. To this end, the first rotation element can be configured in a special embodiment in a manner such that it is receivable directly in an arbitrarily designed receiving apparatus of the microscope system.

Since tilting and rotation of the sample can be set independently from one another by a coordinated movement of the at least two rotation elements, it is possible for the function according to the disclosure of the turnable rotation elements to replace the tilt and rotation axles of conventional sample stages.

Eccentric rotation elements can produce a lateral shift of the sample by way of movements that are coordinated with the movement of the other rotation elements and thereby replace the linear axles of conventional sample stages for the lateral shift of the sample within certain limits. The use of rotation axles with a spindle-shaped thread rather than pin-shaped rotation axles can replace the height adjustment of conventional sample stages within certain limits.

In an embodiment, the second rotation element of the sample holder system is designed such that it can receive the sample to be examined. For this purpose, a sample receptacle can be provided on the upper side surface (also referred to as sample receiving surface below) of the second rotation element.

The designation "upper" here refers in each case to a side surface facing the sample. In the operating state, that is to say when the sample holder system is used in the microscope system, the "upper" side surface is consequently arranged such that it faces the incident particle beam. The "lower" side surface, by contrast, designates the side surface of a rotation element that faces the holder receiving surface (that is to say the base element).

The rotation elements of the sample holder system can each have a rotation axis around which the respective rotation element is arranged so that it is turnable. This means that the first rotation element has a first rotation axis about which it can be rotated by the angle β1. The second rotation element has a second rotation axis about which the second rotation element is turnable by the angle β2.

The second rotation element can here be connected to the first rotation element in a turnable fashion, whereas the first rotation element can be connected to the base element in a turnable fashion. The rotation elements can be stacked one above the other and are receivable together on the base element. In this way, the sample holder system according to the disclosure can offer at least two rotational degrees of freedom of movement for moving the received sample.

The angles β1 and β2 can be freely selectable or selectable within certain limits. In a special embodiment, it is also conceivable that one of the angles β is fixed.

In an alternative embodiment, the second rotation element can rotatably receive a third rotation element rather than a sample, wherein the third rotation element then has the function of receiving and holding the sample. In this embodiment, it is thus the upper side surface of the third rotation element that can serve as the sample receiving surface (also referred to as sample receiving surface of the third rotation element below).

The third rotation element can have a third rotation axis about which it is arranged so as to be turnable by the rotation angle β3.

The third rotation element can be designed such that it allows an additional rotation of the sample without the degree of tilt being changed. For this purpose, the third rotation element can be cylindrical and the third rotation axis extends parallel to the cylindrical axis and is perpendicular to the upper side surface of the second rotation element. It can be desirable if the upper side surface and the lower side surface of the third rotation element are aligned parallel to one another. In other words, the third rotation element is not wedge-shaped. This can ensure that the extent of the tilt of the sample is maintained, even though the third rotation element is turned.

Turning the sample via the third rotation element can allow the sample to be aligned optimally for observing and/or processing purposes in the tilted state.

The third rotation element can have a circular, elliptical, square or another basic shape.

Moreover, it is conceivable that the sample holder system also comprises further rotation elements that are designed as described and coact in order to keep a sample tiltably and rotatably on the sample holding system.

Owing to the wedge-type profile of the rotation elements and since the two rotational degrees of freedom of movement can be coordinated with one another, the extent and direction of the tilting of the held sample can be adjusted continuously using the sample holder system. When the sample holder system is mounted on a multi-axis sample stage, the latter typically offers further degrees of freedom of movement.

The wedge angle $\alpha 1$ of the first rotation element and the wedge angle $\alpha 2$ of the second rotation element can be the same. However, it is also possible for the sizes of angles $\alpha 1$ and $\alpha 2$ to differ, meaning that the rotation elements have wedge shapes of different steepness. In addition, it is conceivable for a set with different rotation elements to be used, which each have different wedge angles $\alpha x$. This can be desirable in order to be able to flexibly set different tilt angles depending on the relevant application.

The disclosure additionally relates to a method for setting the inclination angle of a sample that is held in a microscope system with the aid of the described sample holder system.

By selectively changing the rotation angles $\beta 1$ and $\beta 2$ by rotating the first and the second rotation element, the rotation angles $\beta 1$ and $\beta 2$ and the wedge angles $\alpha 1$ and $\alpha 2$ can combine in a way such that the inclination of the sample in relation to the holder receiving surface of the base element and in relation to the optical axis or axes is settable.

If the sample holder system used additionally has a third rotation element without a wedge profile, it is possible to set not only the inclination of the sample as desired, but also the alignment of the sample in relation to the optical axis/axes.

Exemplary embodiments of the disclosure are explained below with reference to figures. For the purpose of explaining the components, therefore, reference is also made to the respectively preceding and succeeding description in its entirety.

EXEMPLARY EMBODIMENTS

Figure 1:
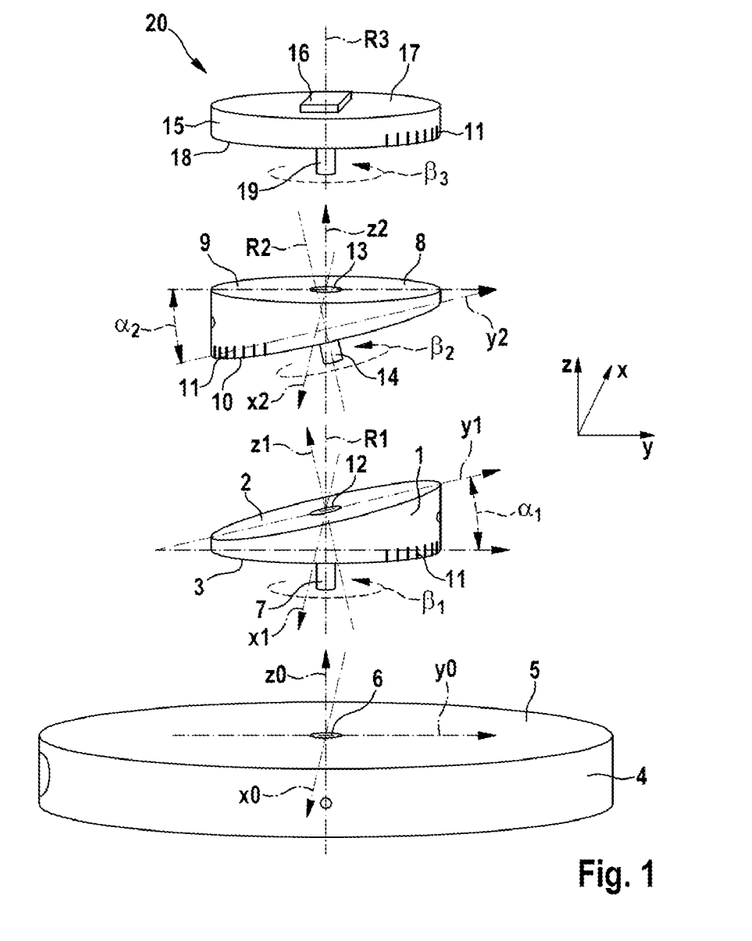
FIG. 1 shows, in an exploded view, an embodiment of a sample holder system according to the disclosure, wherein the sample holder system comprises three rotation elements.

FIG. 1 shows an embodiment of the sample holder system 20, in which the sample holder system 20 has three rotation elements 1, 8, 15, which coact.

The sample holder system 20 comprises a first rotation element 1, which has a first side surface (upper side surface) 2 and a second side surface (lower side surface) 3. The first and the second side surface 2, 3 are arranged so as to lie opposite one another and enclose an angle $\alpha 1$. In other words: The first rotation element 1 has the shape of a wedge in which two side surfaces 2, 3 converge at an acute angle $\alpha 1$. What is involved here is that the first and the second side surface 2, 3 are not aligned parallel to one another, but extend towards each other and form an angle $\alpha 1$.

The cross section of the rotation element 1, which is embodied in the manner of a wedge, can, as is illustrated in FIG. 1, have the shape of an irregular right-angled triangle. However, the disclosure is not restricted to such a shape. It is also conceivable that the wedge shape in the cross-sectional profile does not have a right angle but is formed by any arbitrary acute-angled triangle. The cross-sectional profile can here be in the shape of an irregular or an isosceles or an equilateral triangle. The side face of the rotation element lying opposite the angle $\alpha$ can have any desired design, for example a straight line (in the cross-sectional profile) or a portion of a circle (in the cross-sectional profile).

The first rotation element 1 has a rotation axis R1 about which the first rotation element 1 is rotatably arranged. It can be desirable if the first rotation element 1 can be rotatably connected to a base element 4, wherein turning is effected via the rotation axle R1.

The base element 4 can be present in the form of a base plate 4 or of a sample stage of a microscope system.

A base plate 4 is understood to mean a structural component that is mountable on the sample stage of the microscope system and in addition can receive the rotation element 1. It has been found to be desirable for the base plate 4 to have, for example, the shape of a flat cuboid. However, the base plate 4 can also be cylindrical or have the shape of a polygon or another shape. At any rate, the shape of the base plate should be selected such that the movement of the rotation elements is not obstructed by the base plate.

In the alternative embodiment, the sample stage of the microscope system serves as base element 4. In this case, the first rotation element 1 is directly mounted rotatably on the sample stage.

The embodiments described of the base element 4 have in common that the base element 4 in each case has a sample holder receiving surface 5 (also referred to as holder receiving surface below), which, during operation of the sample holder system 20 in a microscope system, can be arranged perpendicular to the optical axis of the microscope system.

In an embodiment of the sample holder system, the first rotation element I is configured such that its rotation axis R1 is aligned perpendicular to the holder receiving surface 5. For this purpose, the first rotation element 1 is configured such that the second side surface 3 is receivable on the holder receiving surface 5. In this case, the second side surface 3 and the holder receiving surface 5 can be arranged in a manner such that they lie opposite one another and are aligned parallel to one another. In this way, the rotation axis R1 is aligned both perpendicular to the second side surface 3 (of the first rotation element 1) and also perpendicular to the holder receiving surface 5 (of the base element 4).

The precise alignment (spatial orientation) of the base element 4 and consequently also of the holder receiving surface 5 can be described with a coordinate system. Said coordinate system of the base element has the spatial axes z0, x0 and y0, which are each arranged orthogonally to one another.

It can be desirable here if the holder receiving surface 5 of the base element 4 is arranged in a plane spanned by two spatial axes of said coordinate system, for example by x0 and y0.

The changes in the spatial orientation of the sample 16 which are brought about with the sample holder system according to the disclosure and will be described below in each case refer to the coordinate system of the base element 4.

It has been found to be desirable for the rotation axis R1 of the first rotation element 1 to is align axis-parallel to one of the axes of the base element 4. It can be desirable here if the rotation axis R1 is parallel to the axis z0.

In order to rotatably connect the first rotation element 1 to the base element 4, the base element 4 can have for example a hole 6, into which a pin-type connection 7 connected to the first rotation element 1 can be inserted with a precise fit. The longitudinal axis of the pin 7 then corresponds to the rotation axis R1, about which the first rotation element 1 is rotatable in relation to the base element 4. The first rotation element 1 is here rotatable relative to the holder receiving surface 5 by a rotation angle β1. The rotation axis R1 is aligned perpendicular to the y0 axis of the base element 4.

In addition, the sample holder system 20 has a second rotation element 8, which likewise has two opposite side surfaces, to be precise a third side surface 9 (upper side surface) and a fourth side surface 10 (lower side surface), which together form an acute angle α2. That is to say that the second rotation element 8 also has a wedge-type shape, which can be designed just as described above for the first rotation element 1.

The second rotation element 8 has a rotation axis R2 about which the second rotation element 8 is rotatably arranged, wherein the second rotation element 8 is rotatably connected to the first rotation element 1. The rotation axis R2 is aligned perpendicular to the fourth side surface 10 of the second rotation element 8.

It can be desirable for the fourth side surface 10 and the first side surface 2 of the first rotation element to be arranged such that they lie opposite one another and are aligned parallel to one another. The rotation axis R2 of the second rotation element 8 is then not only aligned perpendicular to the fourth side surface 10, but also perpendicular to the first side surface 2.

In addition, the sample holder system 20 comprises a third rotation element 15 having a sample receiving surface 17 for receiving a sample and, lying opposite, a side surface 18.

The third rotation element 15 is configured to receive a sample 16 to be examined. For this purpose, the sample 16 is applied onto the sample receiving surface 17 (upper side surface) of the third rotation element 15, for example with the aid of a correspondingly designed sample receptacle (not illustrated). A clamping apparatus can thus be present, such as for example a setscrew. As an alternative it is conceivable that the sample 16 is glued onto the sample receptacle or directly onto the sample receiving surface 17 of the third rotation element so as to fasten it.

The third rotation element 15 has a rotation axis R3, about which the third rotation element 15 can be rotated in relation to the second rotation element 8 by an angle β3. For this purpose, the third rotation element 15 is rotatably connected to the second rotation element 8, wherein the third rotation axis R3 is aligned perpendicular to the side surface 18 of the third rotation element 15.

It can be desirable for the side surface 18 of the third rotation element and the third side surface 9 of the second rotation element to be arranged opposite one another and are aligned parallel to one another, with the result that the rotation axis R3 is perpendicular to the side surface 18 of the third rotation element and perpendicular to the third side surface 9 of the second rotation element 8.

It has proven to be desirable for the third rotation element 15 to have a pin-type connection 19, which can be inserted into a hole 13 of the same diameter at the centre of the upper side surface 9 of the second rotation element 8. The connecting pin 19 serves as the rotation axis/axle R3 with which the third rotation element 15 is rotatable in relation to the second rotation element 8 by the angle β3 coaxially with the central axis of the upper side surface 9 of the second rotation element 8.

Figure 2A:
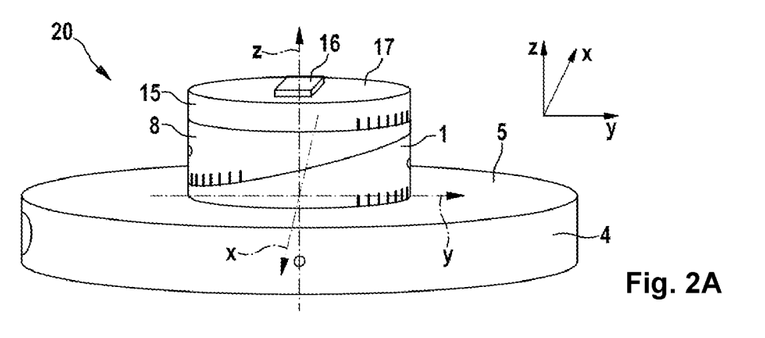
FIGS. 2A-2C show the sample holder system of FIG. 1 in two different operating states (FIG. 2A, FIG. 2C) and in the view from above (FIG. 2B).
Figure 2B:
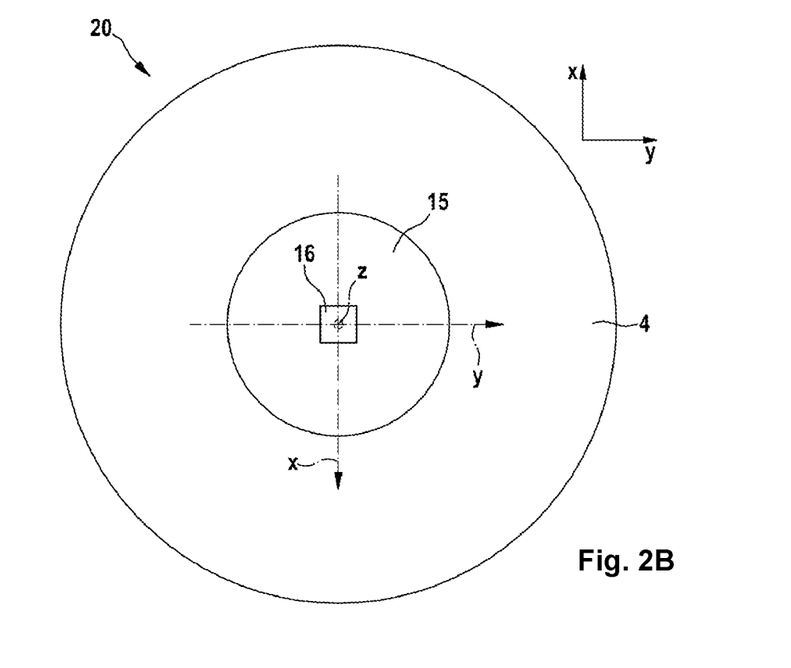
Figure 2C:
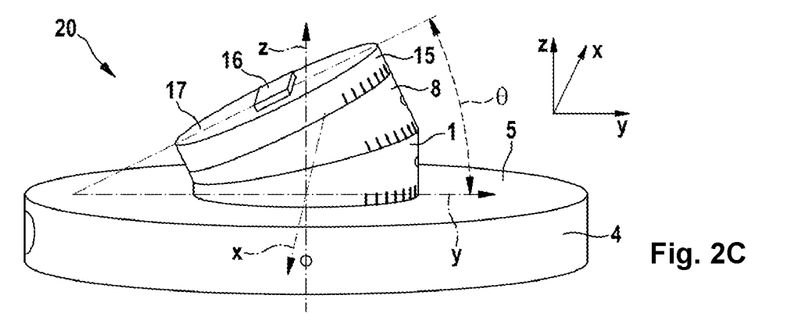
Figure 3:
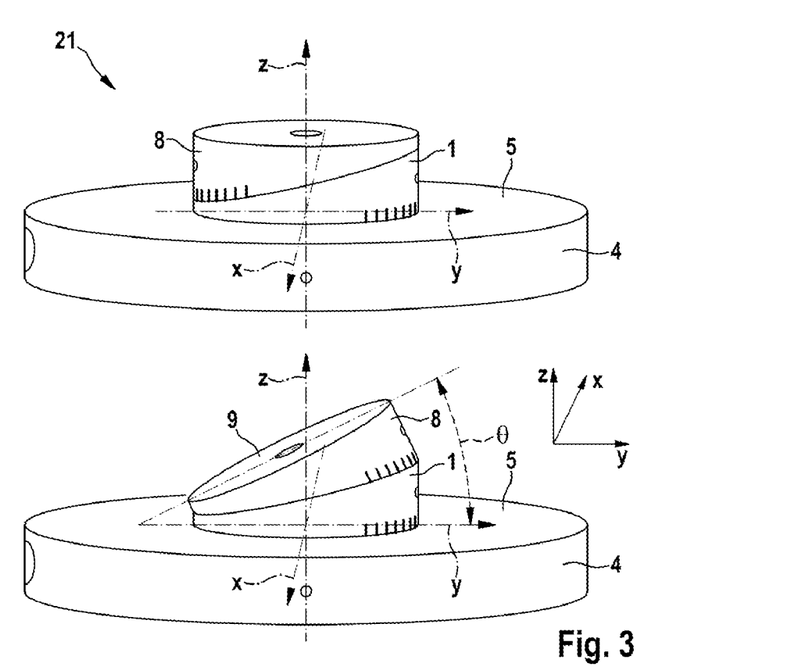
FIG. 3 shows an alternative embodiment comprising only two rotation elements.

The bases of the rotation elements can be, for example, circular (as illustrated in FIGS. 1 to 3) or elliptical. However, the design of the rotation elements is not restricted to the aforementioned shapes. Rather, it is also conceivable that the rotation elements have any other desired shapes.

Instead of the described connection of the rotation elements with holes and pin connections, a turnable bearing can be used. For this purpose, ball bearings or other suitable mechanical connections can be used.

The described rotation elements 1, 8, 15 coact in a manner such that they form an open kinematic chain. For this purpose, the rotation elements 1, 8, 15 are arranged in a particular order, i.e. successively. The sample to be examined is here received on the last rotation element of the chain.

The arrangement in an open kinematic chain means that a rotation element carries out in each case not only the rotational movement realized by it, but also passively the movements of the other movement elements which are arranged upstream of said rotation element in the chain. In other words: The rotation axes R1, R2 . . . Rx of the sample holder system are stacked one above the other (also known as axis stacking).

When the sample holder system 20 is received on a sample stage during operation, the open kinematic chain also comprises the translational (x, y and z axes) and rotational movement elements (R, T axes) which the sample stage makes available.

The designations "upper" side surface and "lower" side surface of a rotation element used in the description of the rotation elements 1, 8, 15 in each case relate to the arrangement of the rotation element in the axis stack. In this connection, "lower" denotes the side of the respective rotation element facing the base element. "Upper", by contrast, denotes the side of the rotation element facing the sample receptacle (i.e. the sample). Consequently, the upper side surface is always the surface facing the incident particle beam during the operation in the microscope system, whereas the lower side surface faces away from the incident particle beam.

FIG. 2 shows the sample holder system 20 of FIG. 1 in operation, specifically in two is different, exemplary operating states.

FIG. 2A shows the case that $\alpha 1=-\alpha 2$, while $\beta 1=0°$ and $\beta 2=180°$. In this case, the tilt angle $\theta$ of the sample receiving surface 17 (of the third rotation element), which holds the sample, is 0° in all directions. The sample 16 is thus not tilted in any direction, and the particle beam can therefore be incident substantially perpendicularly on the sample surface during the microscopic observation or examination.

To illustrate the spatial directions, FIG. 2b shows the situation from above. In this illustration, the z axis is arranged perpendicular to the plane of the drawing.

FIG. 2C, in which the wedge angles of the rotation elements add up, shows the opposite case to FIG. 2A.

Here: $\alpha 1=-\alpha 2$, while $\beta 1=0°$ and also $\beta 2=0°$. In the y direction of the base element, this gives the maximum tilt angle $\theta$ of $|\alpha 1|+|\alpha 2|$.

In other words: The maximum tilt angle in the y direction corresponds to the sum of the absolute values of the wedge angles $\alpha 1 \ldots \alpha x$. In the x direction of the base element, the tilt angle of the sample 16 is 0°, by contrast.

However, the disclosure is not restricted to the embodiment with three rotation elements described above. In an embodiment, the third rotation element is omitted, as is illustrated in FIG. 3. In this case, the second rotation element 8 is configured to receive the sample. For this purpose, the second rotation element 8 can comprise on the upper side surface 9 a clamping apparatus (for example a setscrew) or a sample receptacle of another design type, in which the sample can be received. Alternatively, the sample can be glued on.

However, it is also conceivable that the sample holder system has more than three rotation elements. In such a case, the sample holder system comprises not only the three rotation elements shown in FIG. 1, but also further analogously formed rotation elements arranged rotatably in relation to one another.

As is illustrated in FIG. 2 and FIG. 3, the tilting and rotation of a sample 16 held by the sample holder system 20, 21 according to the disclosure are the result of the combination of all wedge angles $\alpha x$ and all rotation angles $\beta x$ of the rotation elements in the open kinematic chain.

In the simplest case, the sample holder system 21 comprises only two rotation elements 1, 8.

Owing to the combination of the angles $\alpha 1$, $\alpha 2$, $\beta 1$ and $\beta 2$, the inclination of the upper side surface 9 of the second rotation element 8 in relation to the base element 4 (to be more precise, in relation to the holder receiving surface 5 of the base element 4) can be freely set in terms of direction and extent.

This is also true if a third rotation element 15 is present, as is shown in FIG. 2. Since the third rotation element 15 in the embodiment shown in FIGS. 1 and 2 does not have a wedge shape (upper side surface 17 and lower side surface 18 are parallel to one another), the combination of the stated angles also determines the inclination of the upper side surface (sample receiving surface) 17 of the third rotation element, which carries the sample 16.

The tilt angles in the x and y directions of the base element are dependent on the wedge angles $\alpha 1$ and $\alpha 2$. The mathematical relationships between these angles can therefore be analytically derived.

For example, the tilt angle of the upper side surface (third side surface) 9 of the second rotation element 8 in the x direction of the base element is: $-a \cos((\sin(\beta 1)*\cos(\alpha 1)*\cos(\beta 2)+\sin(\beta 2)*\cos(\beta 1))*\sin(\alpha 2)+\sin(\alpha 1)*\sin(\beta 1)*\cos(\alpha 2))+\pi/2$.

is The tilt angle of the upper side surface (third side surface) of the second rotation element in the y direction of the base element is: $-a \cos((\sin(\beta 1)*\sin(\beta 2)-\cos(\alpha 1)*\cos(\beta 1)*\cos(\beta 2))*\sin(\alpha 2)-\sin(\alpha 1)*\cos(\alpha 2)*\cos(\beta 1))+\pi/2$.

If $\beta 1$ and $\beta 2$ change, the mounted sample also turns. This turning of the sample, however, can be rotated back into the original spatial orientation by turning the third rotation element by an angle $\beta 3$ about the rotation axis R3. That means that the optional third rotation element makes available an additional degree of freedom of movement for moving the sample. It can be desirable here for the set tilt angle to not be changed because the angles $\beta 1$ and $\beta 2$ are not influenced by the rotation about R3.

The angle $\beta 3$ to be selected is likewise dependent on the angles $\alpha 1$, $\alpha 2$, $\beta 1$ and $\beta 2$ and can be derived analogously to the abovementioned shapes.

It can be desirable for the rotation of the rotation elements to be effected by motor. For this purpose, suitable motors can be installed in the base plate or in the sample stage.

Alternatively, the drive motors can also be arranged outside the sample holder system. It is thus conceivable to bring about the setting of the sample inclination in situ in the sample chamber of the microscope system by remotely controlling the motors from the outside, without the need to manually move the rotation elements. The software controller of the microscope system can be used for this purpose.

In a special embodiment, it is additionally conceivable that the rotation of the rotation elements is passively effected, specifically by using the movement of the sample stage via a suitable carrier apparatus.

In the sample holder system according to the disclosure, it is furthermore conceivable that the rotation elements used have different wedge angles $\alpha$. That means that the wedge shapes of the rotation elements manifest to different extents. In this way, rotation elements having different angles $\alpha$ can be combined. The maximum inclination angle of the sample receiving surface that is achievable with the sample holder system can thereby be varied depending on the application and type of the sample.

If the sample is mounted exactly at the centre of the second rotation element, the height of the sample surface over the surface of the base element is here independent of the tilt angles. Thus, the sample surface is here eucentric, which means changes in the tilt angle do not bring about a shift of this sample location.

It is conceivable that eucentricity is achieved for all tilt and rotation angles with arbitrary positioning of the sample on the second or third rotation element by using further mechanical extensions. A mechanical extension of this type can, for example, be the support of the rotation elements on thread spindles having a suitable thread pitch rather than simple pin-type connections. Another possibility is the tilted support of the first rotation element on the base element or a wedge-shaped embodiment of the third rotation element or the combination of these possibilities.

It has proven to desirable for each of the rotation elements 1, 8, 15 to have a scale 11, as shown in FIG. 1 and FIG. 2. The scales 11 are used to set the angles $\beta 1$ and $\beta 2$ to be coordinated with one another such that a received sample 16 adopts the desired tilt and turned position in relation to the coordinate system of the holder receiving surface 5 (i.e. in relation to the base element). The scales 11 are designed such that they correspond to the mathematical relationship between the desired inclination angles and the wedge angles $\alpha 1$ to $\alpha x$ and also the rotation angles $\beta 1$ to $\beta x$.

Owing to a corresponding embodiment of the scales on the rotation elements, the tilt angles of the upper side surface of the second rotation element in the x and y directions of the base element can be set in a targeted and clear manner. It is likewise possible for the rotation angle of the optional third rotation element to be set in a defined manner with the aid of the scale located on the third rotation element.

The tilt angles θ of the sample receiving surface (and thus of the sample) are set with a stepped-down reduction that is all the greater the smaller the wedge angles α1 and α2 are. The sample holder system according to the disclosure can therefore be set with significantly greater precision than previously known adjustable tilt holders.

That is because in the present sample holder system, the tilt angles are attained by turning wedge-shaped rotation elements in a manner such that not only the tilt angles themselves but also their errors are dependent on the angle scales via the above-stated mathematical relationships. Since the changes in rotation angle to attain a specific tilt angle are greater than the tilt angle changes that are caused thereby themselves, the setting errors are also reduced to the same extent.

Since the desired tilt angles and the possibly desired counter-rotation of the sample by β3 are dependent on α1 and α2 and also on β1 and β2, it is possible to find a mathematical formulation for the design of the scales.

For example, the total tilt could be set with a first scale, while a second scale sets the relative components of the tilts in the x and y directions.

If no scale graduation that is sufficiently easy to manage by an unskilled user can be found, the turning angles to be set can be calculated using software.

It can be desirable for the sample holder system to be without play when all the rotation elements are fixed. In the motorized version of the sample holder system, it is possible to eliminate play for example by frictional adhesion of the rotation elements or by inhibition of the turning motors.

Figure 4:
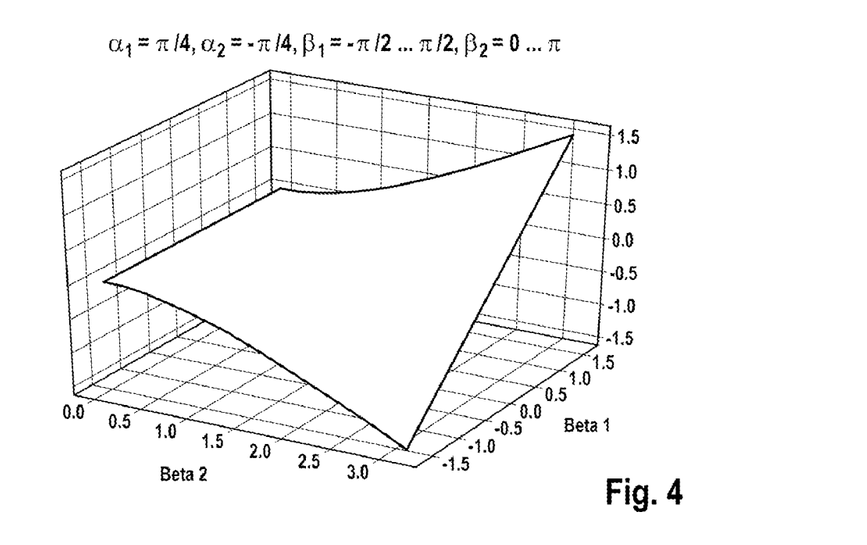
FIG. 4 shows the dependence of the settable tilt angle of a received sample on the rotation angles $\beta 1$ and $\beta 2$, in reference to the x direction of the coordinate system of the base element.
Figure 5:
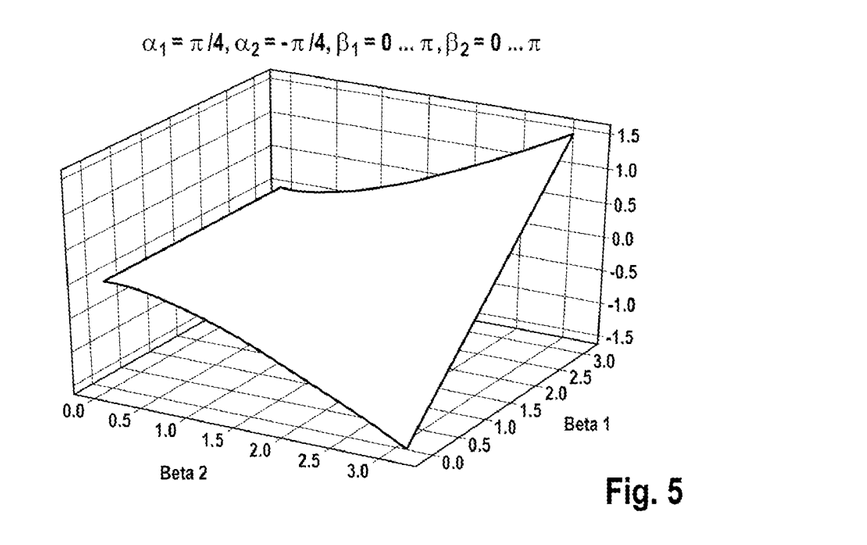
FIG. 5 shows a dependence of the tilt angle of a received sample on the rotation angles $\beta 1$ and $\beta 2$, in reference to the y direction of the coordinate system of the base element.

FIG. 4 and FIG. 5 illustrate the dependence of the sample tilt angle in the spatial directions x and y, with reference to a superordinate reference coordinate system.

FIGS. 4 and 5 here relate to the case that both wedge angles are α=45°, that is to say is when α1=45° and α2=-45°.

The figures respectively show the dependence of the tilt angle of the upper side surface of the second rotation element on the selected rotation angles β1 and β2.

In FIG. 4, the specification of the tilt angle refers to the x direction of the coordinate system of the base element. All angles are shown in radian (rad) in the figure.

In FIG. 5, the specification of the tilt angle refers to the y direction of the coordinate system of the base element, and the same conditions as for FIG. 4 apply otherwise.

The sample holder system according to the disclosure can be used with the feature that when processing samples in an SEM FIB combination device with a laser apparatus. When processing samples with a pulsed laser, the intention is frequently to produce cross sections that are oriented perfectly perpendicularly to the sample surface. However, the result in principle is always cross sections that are inclined by up to 20° to the perpendicular. The exact angle of the deviation depends on the sample material and the laser parameters used. Since the laser beam can frequently not be set to a different angle of incidence, perpendicular cross sections can be achieved only by counter-tilting the sample. The disclosure now represents a compact, precisely settable solution that is of a low height if correspondingly designed (for this application, for example $\alpha_1=-\alpha_2=10°$ would suffice).

A further important application of the laser option is the cutting of pillars out of the full sample, wherein the pillars have a size of a few tens of micrometres to a few hundred micrometres. The intention in this case is to cut pillars that are as cylindrical as possible, which, for the stated reason, is possible only by counter-tilting the sample. The tilt axle would have to rotate counter to the laser beam guided on circular trajectories. This can be implemented with the motorized version of the sample holder system according to the disclosure.

Another application of the sample holder system is the analysis of samples with a ToF-SIMS (time-of-flight secondary ion mass spectroscopy) detector. It may be possible here that the detector lies on a different axis than the exciting FUB beam, for example laterally and/or at a different height. In samples that have a surface topography, this results in inhomogeneous detection. Since the present disclosure provides further degrees of freedom of movement such that the samples can be aligned differently in relation to the detector, this can be avoided.

In addition, it is conceivable to use the sample holder system described as an alternative to rocking stage applications. Rocking stage methods are used in order to avoid what is known as "curtaining" when generating sample cross sections with the focused ion beam by continuously eucentrically tilting the sample stage to and fro during the material ablation. Swaying the sample stage to and fro can be replaced by the tilting using the sample holder system according to the disclosure.

Figure 6:
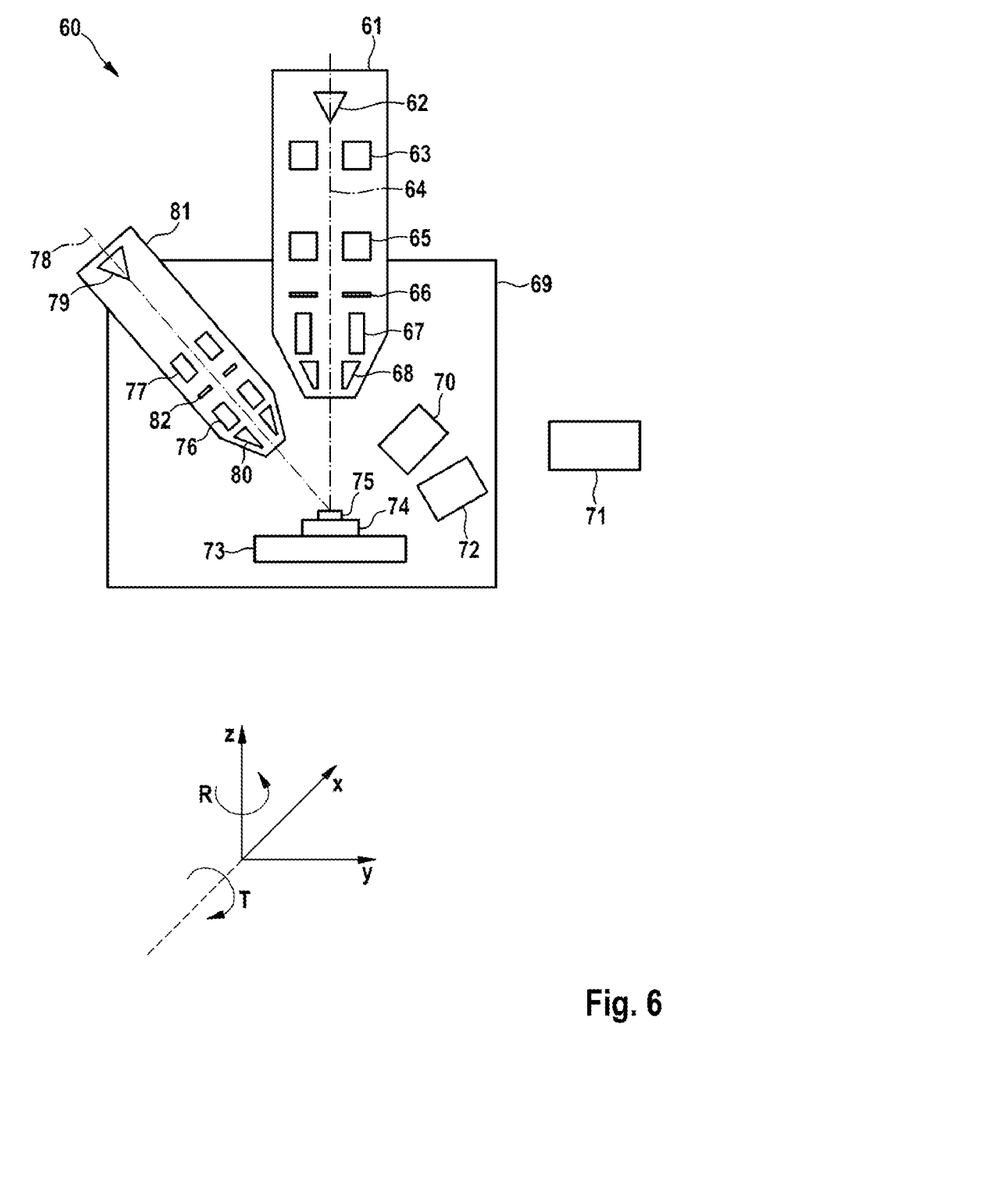
FIG. 6 shows by way of example a two-beam device, which is set up to receive a sample holder system according to the disclosure.

FIG. 6 shows, using the example of an FIB SEM combination device 60, a microscope system in which the sample holder system according to the disclosure can be used and in which the method according to the disclosure can be carried out.

In order to make available a sample 75 to be examined for microscopic examination or processing, the sample 75 is held by a sample holder system 74 according to the disclosure. The sample holder system 74 is mounted on an apparatus in a sample chamber 69 of the microscope system 60, for example on a sample stage 73.

The sample stage 73 is arranged in the sample chamber 69 of the FIB-SEM combination device 60, where vacuum conditions prevail during operation.

It can be desirable for the sample stage 73 to be designed as a multi-axis sample stage, as a result of which a plurality of translational and rotational degrees of freedom of movement are made available. This is the case, for example, if the sample stage 73 is embodied as a five-axis stage comprising the translational axes x, y and z and the rotation axes R and T (tilt axis). In this case, the translation axes mentioned are aligned in each case perpendicular to one another.

The sample 75 to be examined can thus be displaced in the three spatial directions x, y and z by a multi-axis stage in order to change the pose of the sample 75. The pose is understood to mean the positioning of the sample 75 in three-dimensional space. The exact pose can be described by giving x, y and z coordinates.

In addition, the spatial orientation, i.e. the alignment of the sample 75 in relation to the optical axis/axes of the microscope system, can be altered by the sample 75 being turned and/or tilted via the rotation axes R and T.

In this case, it can be desirable for the sample stage to be designed as a eucentric sample stage 73. That means that a sample 75 which is arranged on the sample stage 73 and is localized at the eucentric point can be tilted without the sample 75 moving laterally in the process. Alternatively, the sample stage can be designed as what is known as a super-eucentric six-axis stage, which has an additional M-axis.

The microscope system 60 comprises two particle beam columns, specifically an electron beam column 61 for producing an electron beam and an ion beam column 81 for producing an ion beam. Both particle beams are directed at the sample 75 to be processed, which can be situated at the coincidence point of both particle beams.

For the case that the microscope system 60 does not comprise a sample stage—different from what is illustrated in FIG. 6—the sample holder system 74 can also be mountable on a different apparatus in the sample chamber 69.

During the operation of the FIB-SEM combination device 60, primary electrons are generated in an electron source 62, said primary electrons being bundled, parallelized or scattered along an optical axis 64 of the electron beam column by a condenser lens system or a plurality of condenser lens systems 63, 65 and trimmed by at least one aperture stop 66. In addition, the electron beam column 61 comprises a deflection system 67, which enables the primary electron beam to be guided over the sample 75 in raster-type fashion, and also an objective lens system 68, with the aid of which the primary electron beam can be focused onto the sample 75.

The FIB-SEM combination device 60 moreover comprises an ion beam column 81 with an ion source 79, a deflection system 77, an aperture stop 82 and a lens system 76. The ion source 79 can be a liquid metal ion source (LMIS), for example, which is operated with a gallium ion source, for example.

The ions generated in the ion source 79 are accelerated along the optical axis 78 of the ion beam column, bundled and focused onto the sample 75 via an objective lens system 80. The ions incident on the sample 75 can be used to ablate material of the sample 75 and/or to image the sample 75. The microscope system 60 can optionally also have a gas injection system 72 for introducing process gases.

Furthermore, the FIB-SEM combination device 60 comprises at least one detector 70 for detecting interaction products of the interaction of the electrons and/or ions with the sample 75.

In addition, the microscope system 60 can comprise an evaluation and control unit 71. The evaluation and control unit 71 can execute a sequence of control commands comprised in a computer program product. By the execution of the control commands, the microscope system 60 is caused to carry out an embodiment of the method according to the disclosure for setting the inclination angle of the sample, as is illustrated using the example of FIG. 7.

Figure 7:
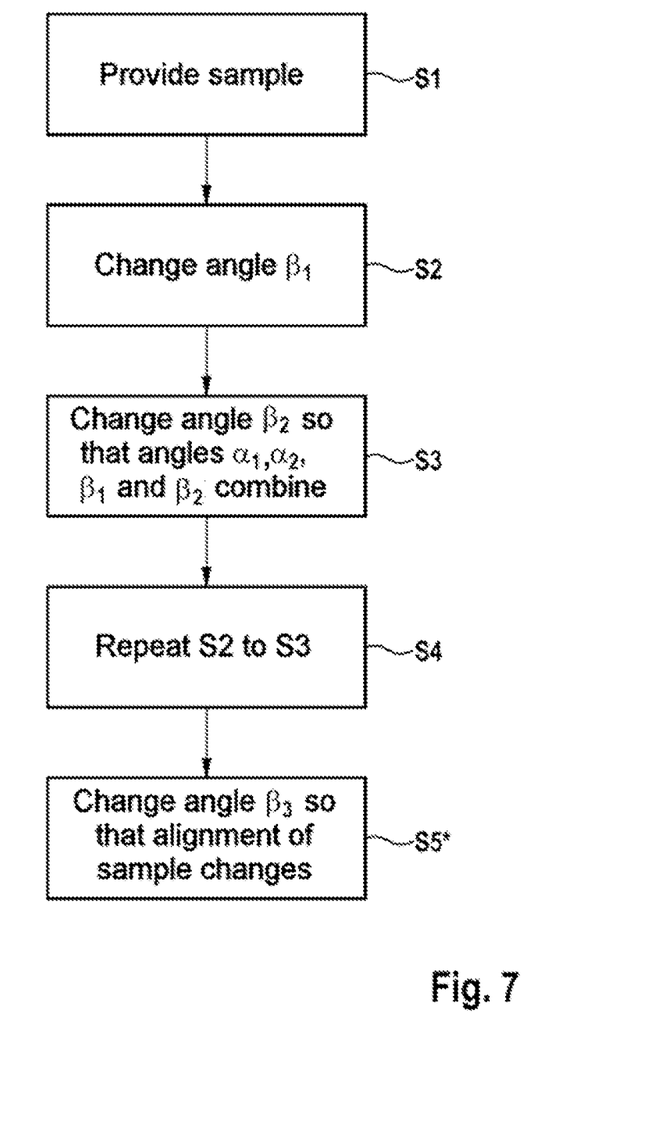
FIG. 7 shows a flowchart of the method according to the disclosure for tilting a sample with the aid of the sample holder system.

FIG. 7 schematically shows a flowchart of the method according to the disclosure for tilting a sample with the aid of the sample holder system.

First, a sample to be examined is provided in step S1. The sample is held by the sample holder system according to the disclosure in the sample chamber of the microscope system used. For this purpose, the sample is received either directly on the fourth side surface (upper side surface) of the second rotation element (as is illustrated in FIG. 3) or—if a further rotation element is present— is received on said rotation element (as is shown in FIGS. 1 and 2).

The angle $\beta1$ is now changed in step S2 by rotating the first rotation element about the rotation axis R1 in relation to the holder receiving surface of the base element.

Next, the angle $\beta2$ is changed in step S3 by rotating the second rotation element about the rotation axis R2. In this way, the wedge angle $\alpha1$ of the first rotation element, the wedge angle $\alpha2$ of the second rotation element, and the two rotation angles $\beta1$ and $\beta2$ are combined, resulting in a change in the inclination of the sample in relation to the holder receiving surface of the base element. If the holder receiving surface assumes a specific orientation in relation to the optical axis of the microscope system, the combination of said angles also brings about a change in the inclination of the sample in relation to the optical axis.

In step S4, steps S2 and S3 are repeated until the desired inclination angle of the sample in relation to the holder receiving surface is set. In practice, the tilt angle of the sample is typically set in relation to the optical axis or axes of the microscope system in order to be able to set in this way the angle of incidence of a particle beam on the sample.

In an optional step S5, the angle $\beta3$ is additionally changed by turning the third rotation element about the rotation axis R3. In this way, the sample can adopt a desired alignment in a plane parallel to the third side surface.

It can be desirable for the third rotation element to have an upper side surface 17 (i.e. sample receiving surface of the third rotation element) and a lower side surface 18, which are arranged parallel to one another, as is illustrated in FIG. 1. In this way, the alignment of the sample (i.e. the spatial orientation of the sample in the plane defined by the axes x and y) can be changed without the tilt angle of the sample being changed.

LIST OF REFERENCE SIGNS

1 First rotation element
2 First side surface (upper side surface of the first rotation element)
3 Second side surface (lower side surface of the first rotation element)
4 Base plate (Base element)
5 Holder receiving surface
6 Hole in the base element
7 Pin-type connection
8 Second rotation element
9 Third side surface (upper side surface of the third rotation element)
10 Fourth side surface (lower side surface of the third rotation element)
11 Scale
12 Hole in the first rotation element
13 Hole in the second rotation element
14 Pin-type connection
15 Third rotation element
16 Sample
17 Sample receiving surface (upper side surface) of the third rotation element
18 Side surface (lower side surface) of the third rotation element
19 Pin-type connection
20 Sample holder system
21 Sample holder system
R1 First rotation axis
R2 Second rotation axis
R3 Third rotation axis
$\beta1$ First rotation angle
$\beta2$ Second rotation angle
$\beta3$ Third rotation angle
$\alpha1$ First angle
$\alpha2$ Second angle
$\alpha3$ Third angle
$\theta$ Tilt angle of the sample receiving surface (tilt angle of the sample)
60 Microscope system (SEM-FIB combination device)
61 Electron beam column
62 Electron source 63 First condenser lens system
64 Optical axis of the electron beam column
65 Second condenser lens system
66 Aperture stop
67 Deflection system
68 Objective lens system (SEM)
69 Sample chamber
70 Detector
71 Evaluation and control unit
72 Gas injection system
73 Sample stage
74 Sample holder system
75 Sample
76 Lens system
77 Deflection system
78 Optical axis of the ion beam column
79 Ion source
80 Objective lens system (FIB)
81 Ion beam column
x x-axis
y y-axis
z z-axis
R Rotation axis
T Tilt axis

What is claimed is:

1. A sample holder system, comprising:
a first rotation element; and
a second rotation element,
wherein:
the first rotation element has a first side surface and a second side surface opposite the first side surface so that they define an angle α1 and the first rotation element has a wedge-shaped cross section;
the second rotation element has a third side surface and a fourth side surface opposite the third side surface so that they define an angle α2 so that the second rotation element has a wedge-shaped cross section;
the second rotation element is configured to receive on the third side surface a member selected from the group consisting of a sample and a third rotation element;
the second rotation element has a rotation axis R2 perpendicular to the fourth side surface;
the second rotation element is rotatable relative to the first rotation element by a rotation angle β2 about the rotation axis R2;
the first rotation element is configured to be rotatably received on a holder receiving surface;
the first rotation element has a rotation axis R1 perpendicular to the second side surface;
the first rotation element is rotatable relative to the holder receiving surface by a rotation angle β1 about the rotation axis R1; and
an inclination of the third side surface relative to the holder receiving surface is settable by a combination of the angles α1, α2, β1 and β2.

2. The sample holder of claim 1, wherein:
the fourth side surface and the first side surface are opposite each another and parallel to each other so that the rotation axis R2 is perpendicular to the first side surface;
the second side surface is receivable on the holder receiving surface so that the second side surface and the holder receiving surface are opposite each other; and
the second side surface and the holder receiving surface are parallel to each other so that the rotation axis R1 of the first rotation element is perpendicular to the holder receiving surface.

3. The sample holder of claim 1, further comprising a third rotation element comprising the sample receiving surface and a side surface opposite its sample receiving surface, wherein:
the third rotation element is configured to receive the sample on its sample receiving surface;
the third rotation element is rotatably connected to the second rotation element;
the third rotation element has a rotation axis R3 perpendicular to its side surface; and
the third rotation element is rotatable relative to the second rotation element by the angle β3 about the rotation axis R3.

4. The sample holder of claim 3, wherein the side surface of the third rotation element and the third side surface of the second rotation element are opposite each other and parallel to each other so that the rotation axis R3 is perpendicular to the third side surface of the second rotation element.

5. The sample holder of claim 1, further comprising a base plate mountable on a sample stage, wherein the base plate has a side surface configured to be a holder receiving surface.

6. The sample holder of claim 1, wherein the angles α1 and α2 are fixed values, and the angles β1 and β2 are adaptable.

7. The sample holder of claim 1, wherein the angles α1 and α2 are from 0° to 45°.

8. The sample holder of claim 1, wherein the angles α1 is different from the angle α2.

9. The sample holder of claim 1, wherein the rotation elements comprise settable scales for setting the rotation angles β1 and β2, respectively.

10. The sample holder of claim 9, wherein the scales correspond to a mathematical relationship between desired inclination angles, the wedge angle α1, the wedge angle α2, the rotation angle β1, and the rotation angle β2.

11. The sample holder of claim 1, wherein the sample holder is configured to receive a particle beam microscope.

12. The sample holder of claim 1, wherein the rotation elements have circular bases or ellipsoidal bases.

13. A microscope, comprising:
a sample holder according to claim 1,
wherein the microscope is a particle beam microscope.

14. The microscope of claim 13, further comprising the sample and a sample stage.

15. A method, comprising:
using a sample holder according to claim 1 to hold a sample in a particle beam microscope; and
using a sample holder according to claim 1 to set an inclination angle of the sample in the particle beam microscope.

16. The method of claim 15, further comprising:
a) changing the first rotation angle β1 by rotating the first rotation element about the rotation axis R1; and
b) changing the second rotation angle β2 by rotating the second rotation element about the rotation axis R2 so that the angles α1, α2, β1 and β2 combine to change the inclination of the sample in relative to the holder receiving surface.

17. The method of claim 16, further comprising:
selecting a desired inclination angle for the holder receiving surface; and repeating a) and b) so that the sample has adopts the desired inclination angle relative to the holder receiving surface.

18. The method of claim 17, further comprising changing the third rotation angle $\beta 3$ by rotating the third rotation element about the rotation axis R3 so that the sample has the desired orientation in a plane parallel to the third side surface.

19. One or more machine-readable hardware storage devices comprising instructions that are executable by one or more processing devices to perform operations comprising the method of claim 15.

20. A system comprising:
one or more processing devices; and
one or more machine-readable hardware storage devices comprising instructions that are executable by the one or more processing devices to perform operations comprising the method of claim 15.

* * * * *

UNITED STATES PATENT AND TRADEMARK OFFICE
CERTIFICATE OF CORRECTION

PATENT NO. : 12,196,941 B2
APPLICATION NO. : 17/808380
DATED : January 14, 2025
INVENTOR(S) : Heiko Stegmann Page 1 of 1

It is certified that error appears in the above-identified patent and that said Letters Patent is hereby corrected as shown below:

In the Specification

In Column 7, Line 21, please replace "to is" with -- to --.

In Column 8, Line 66, please replace "two is" with -- two --.

In Column 9, Line 63, please replace "—a cos" with -- -acos --.

In Column 9, Line 66, please replace "is The" with -- The --.

In Column 10, Line 1, please replace "—a cos" with -- -acos --.

In Column 11, Line 38, please replace "say is" with -- say --.

In Column 13, Line 57, please replace "present – is" with -- present–is --.

Signed and Sealed this
Eighteenth Day of March, 2025

Coke Morgan Stewart
*Acting Director of the United States Patent and Trademark Office*